US005848166A

United States Patent [19]

Fisher et al.

[11] Patent Number: 5,848,166

[45] Date of Patent: Dec. 8, 1998

[54] HYBRID ELECTRONIC AND ELECTROMECHANICAL DEVICE FOR THE PRODUCTION OF TREMULANT SOUND

[75] Inventors: John H. Fisher, Salt Lake City; Barry L. Evans, Murray; Kenneth W. Horch, Salt Lake City, all of Utah

[73] Assignee: Ztech L.C., Salt Lake City, Utah

[21] Appl. No.: 374,954

[22] Filed: Jan. 18, 1995

[51] Int. Cl.[6] .......... H03G 3/00

[52] U.S. Cl. .......... 381/62; 84/739

[58] Field of Search .......... 381/62; 84/629, 84/705, 739

[56] References Cited

U.S. PATENT DOCUMENTS

| | | | |
|---|---|---|---|
| 2,622,692 | 12/1952 | Leslie | 381/62 |
| 2,869,667 | 1/1959 | Leslie . | |
| 3,022,853 | 2/1962 | Santi | 381/62 |
| 3,080,786 | 3/1963 | Leslie . | |
| 3,920,905 | 11/1975 | Sharp . | |
| 4,008,641 | 2/1977 | Takada et al. | 381/62 |
| 4,308,428 | 12/1981 | Finch | 84/705 |

OTHER PUBLICATIONS

Review of Inventor's product under "Motion Sound Pro–3" label in Keyboard Magazine, May 1995, pp. 85, 86, 88. Relevenat: p. 86.

Sidebar describing Leslie 302 speaker unit in Keyboard Magazine, Oct. 1993, p. 101. Relevant: p. 101.

Leslie Owner's Manual Model 145 & 145, Aug. 21, 1968.

*Primary Examiner*—Curtis Kuntz

*Assistant Examiner*—Ping W. Lee

*Attorney, Agent, or Firm*—Mallinckrodt & Mallinckrodt

[57] ABSTRACT

An audio tremolo producing system uses a rotating horn as a tremolo producing device for mid and high frequency audio signals, and an electronic tremolo producing device capable of both phase and amplitude modulation for low frequency signals.

10 Claims, 7 Drawing Sheets

HYBRID ELECTRONIC AND ELECTROMECHANICAL DEVICE FOR THE PRODUCTION OF TREMULANT SOUND

BACKGROUND OF THE INVENTION

1. Field

The invention relates to the field of tremulant sound production devices, and specifically to devices known as Leslie speaker systems and to devices that seek to approximate the sound of a Leslie speaker system.

2. State of the Art

An electromechanical device for the production of tremulant sound is described in U.S. Pat. No. 3,080,786 issued to Donald J. Leslie in 1963. This device comprises a housing, a speaker having a rotating horn assembly, and a speaker having a rotating deflector so mounted as to variably distribute sound from the speakers through ports in the housing. Speaker systems incorporating such rotating deflectors or horns are speakers of the Leslie type. Many patents have described improvements and enhancements to the original Leslie mechanical-tremolo speakers.

When a constant note is fed to Leslie-type speakers, the listener will hear an unsteady, throbbing, or tremulant, tone. Rotation of the deflectors or horns cause periodic variations in the sound path from the speaker to the listener's ear as well as changes in resonances within the speaker cabinet. Rotation of horns also leads to a noticeable Doppler effect as the apparent sound source—the end of the horn—approaches and recedes from the listener. These periodic changes in the sound path produce periodic changes in the spectrum, phase and amplitude of sound as heard by the listener.

A popular Leslie speaker, the 136 pound model 147, incorporates a woofer, a mid-high range speaker horn driver, an associated horn, and a crossover network. Signals of less than 800 Hz drive the woofer, and signals of greater than 800 Hz drive the mid-high range speaker horn driver. The horn rotates to variably distribute sound from the mid-high range speaker horn driver through ports in all four sides of a section of a housing. Similarly, a rotating deflector variably distributes sound from the woofer through ports in all four sides of a much larger portion of the housing. The deflector rotates clockwise and the horn rotates counterclockwise as viewed from the top. Separate two-speed motor drives are provided for rotating the horn and for rotating the deflector. Each of these 2-speed motor drives use a pair of 60-Hz AC synchronous motors and a complex clutch arrangement.

Clockwise rotational times of the Leslie model 147 low frequency deflector are approximately 1.5 seconds per cycle in slow mode, and 175 miliseconds in fast mode. Counterclockwise rotational times of the Leslie model 147 mid-high frequency horn are approximately 1.25 seconds per cycle in slow mode, and 150 miliseconds in fast mode.

The Leslie speaker systems were designed for use by musicians playing electronic organs to provide a rich and full pipe organ sound from the electric organ. The Leslie speaker systems became very popular with various performers in the 1970's and the popularity has continued and recently has increased.

While many musicians desire a tremulant sound for their electronic organs or keyboards similar to that produced by a device of the Leslie type, these electromechanical Leslie-type devices are large, quite heavy, and awkward to handle compared to ordinary speaker systems. In addition, since the Leslie-type devices are generally used only with electronic organs or keyboards, and sometimes with other instruments such as electric guitar, performers also need the usual amplifier and speaker systems for their other electrical or amplified instruments and for vocal performances. The Leslie devices are not generally used with such other instruments, and, with keyboards, may be used only selectively. Further, Leslie-type systems produce substantial mechanical vibrations and noises, plus wind noises as parts rotate, which are not a problem during live performances, but which may be objectionable in a modern recording studio. Among these wind noises is a vacuum pop as the horn rotates past the ports in the housing and a microphone is placed near such housing.

Purely electronic tremolo production devices have been disclosed, such as one described in U.S. Pat. No. 3,920,905, issued to Paul Sharp in 1975, wherein frequency or phase modulation is accomplished by means of a variable clock on a "bucket brigade" analog shift register. Recently, attempts have been made to electronically duplicate the sounds produced by Leslie-type speaker systems. However, these attempts have not been successful as judged by many musicians.

SUMMARY OF THE INVENTION

According to the invention, a device for producing tremulant sound that can closely simulate the sound of a Leslie-type speaker but is lighter, more compact, lower cost, and more flexible, includes a mechanically rotated mid-high frequency horn to produce mid-high frequency sound and electronic means to produce processed bass signals. The processed base signals, when amplified and converted to sound by a usual musical instrument amplifier and speaker system, produces tremulant bass sound. It has been found that the mid-high frequency sound as produced by the rotating horn of the Leslie-type speakers is the most difficult to simulate electronically. By producing this sound mechanically with a rotating horn similarly to the Leslie-type speakers, the mid-high frequency sound of the Leslie-type speakers is produced. The bass sound produced by the rotating deflector in the Leslie-type speakers can be simulated electronically so that the low frequency portion of the Leslie-type speaker device can be replaced by electronic circuitry that produces one or more signals for input to a normal musical instrument amplifier and speaker system. The electronic processing of the low frequency signals is coordinated with the mechanical operation of the mid-high frequency horn.

The electromechanical high frequency tremolo production portion of the invention differs from the Leslie implementation in that the shape of the rotating horn allows for a much smaller cabinet than used by Leslie, while approximating the degree and timing of frequency and amplitude modulations induced by the rotating horn of the Leslie model 147. Further, a vacuum elimination hole prevents an annoying pop that can otherwise occur when the speaker horn rotates and a microphone is placed near the unit. The present design also differs in the use of a servo motor to rotate the horn and in the electronics of the servo control motor driver and power amplifier. The motor driver of the present design is configured to closely approximate the rotational speeds in the Leslie model 147.

In constructing the device, it is important that the axle of the rotating horn not be located in the center of the housing. As the speaker rotates in the housing, the acoustic resonances of the housing and horn changes with position. With the axle off-center, these resonance patterns are more complex and repeat only once per rotation instead of once per side of the housing. The openings in the housing are non-uniform, such that the sound radiated to the front is roughly 50% louder than that directed to the back and side; this simulates the sound distribution of a Leslie speaker with its back removed and its back turned to face the audience. This is the preferred configruation of the Leslie-type speaker during performance use.

The low frequency electronic tremolo producing portion of the present invention is quite different from the electro-mechanical system of Leslie. An electronic ramp control circuit and a voltage controlled oscillator are used to generate a modulation control sine wave that simulates the acceleration, deceleration, and rotational rate of a Leslie low-range mechanical deflector. This modulation control sine wave is used to phase-modulate the low frequency components of the audio input, and, if stereo amplifiers and speakers are being used, to swing the signal between a left and a right audio output. When left and right stereo audio outputs are amplified and driven through separate speakers, it will appear to a listener that the audio source is moving across the room. If a monaural amplifier and speaker is used, some of the bass effect is lost, however, the processed low frequency sound, in combination with the mid-high frequency sound produced by the rotating horn, combine to still produce a good simulation of the Leslie-type speaker.

THE DRAWINGS

The best mode presently contemplated for carrying out the invention is illustrated in the accompanying drawings, in which:

FIG. 1 is a pictorial view of a music system incorporating the present invention;

FIG. 2, a block diagram of the present invention;

FIG. 3, a vertical section through the rotating horn used by the present invention for producing tremolo at mid-high range frequencies and its mounting, showing the shape of the horn, the vacuum reduction hole, and the mounting of the horn for rotation;

FIG. 4, a vertical section through the cabinet of the invention showing the horn mounting therein;

FIG. 5, a circuit diagram of the crossover network and mid-high range power amplifier;

FIG. 6, a circuit diagram of the voltage-variable phase-shift network of the system;

FIG. 7, a circuit diagram of the motor control circuit;

FIG. 8, a circuit diagram of the ramp control circuit;

FIG. 9, a circuit diagram of the voltage controlled oscillator circuit;

FIG. 10, a circuit diagram of the left and right amplitude modulator circuits of the system;

FIG. 11, a top view of the rotating horn used for mid-high range tremolo;

FIG. 12, a series of superimposed vertical sections through the rotating horn;

FIG. 13, a top plan view of the cabinet with top removed showing the placement of the rotary horn;

FIG. 14, a perspective view of the shaft mounting for the horn; and

FIG. 15, a block diagram similar to that of FIG. 2, but showing the phase shift function arranged after the left-right modulation function.

DETAILED DESCRIPTION OF THE ILLUSTRATED EMBODIMENTS

Figure 1:
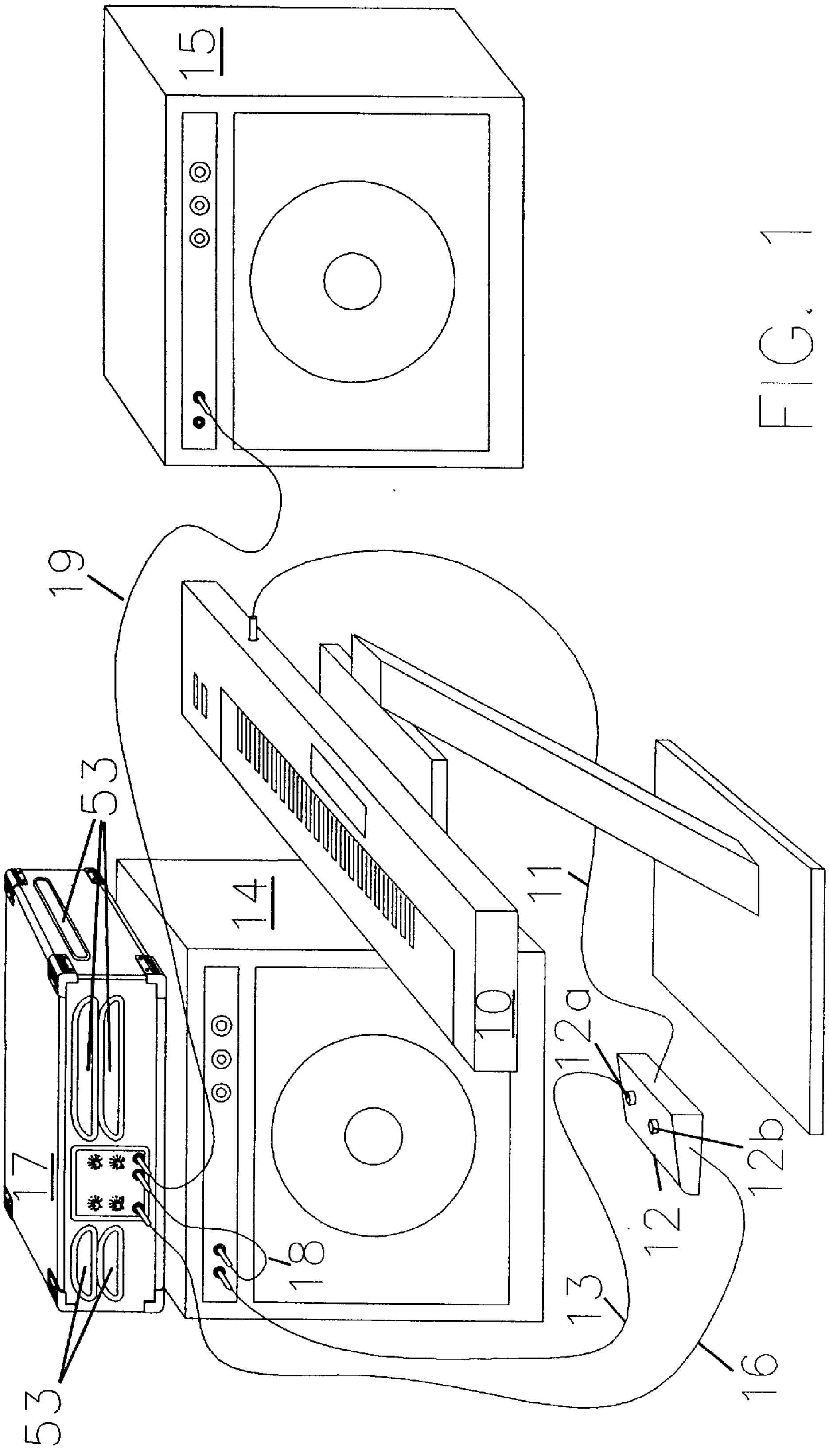

The device of the invention will generally be used by a musical performer playing an electronic keyboard instrument during a performance or a recording session. The device is used to process selected signals from a keyboard instrument 10, FIG. 1, during the performance, and for such purpose, the output of the keyboard instrument 10 is connected by wire 11 to a switch, such as foot switch 12, which, in one position of a rocker control 12*a*, directs the output from the keyboard through wire 13 to normal music instrument amplifier and speaker system 14. A second amplifier and speaker system 15 may also be available. When the performer desires to process a signal from the keyboard through the invention to produce the unique sound effect resulting from use of the invention, the performer changes the position of rocker control 12*a* to direct the signals from keyboard 10 through wire 16 to connection with the invention represented in FIG. 1 as cabinet 17. The signals from the keyboard are processed by the invention and mid-high frequency signals are converted into sound. Low frequency signals are processed and transmitted as stereo signals through wires 18 and 19 to the amplifier and speaker systems 14 and 15 where the low frequency signals are amplified and converted into sound. In some cases, rather than two amplifier and speaker systems 14 and 15, a single amplifier and speaker system, such as just system 14, will be used. In such case, the low frequency signals from the device will be sent to only that single amplifier and speaker system.

Generally, the device of the invention will be used when the performer is using the keyboard to produce certain organ sounds, but not with other sounds. In some cases, other instruments, such as a guitar, will also be connected to the device of the invention. Such instruments will also connect to the device through a switch so that the performer can select when to use the device.

Figure 2:
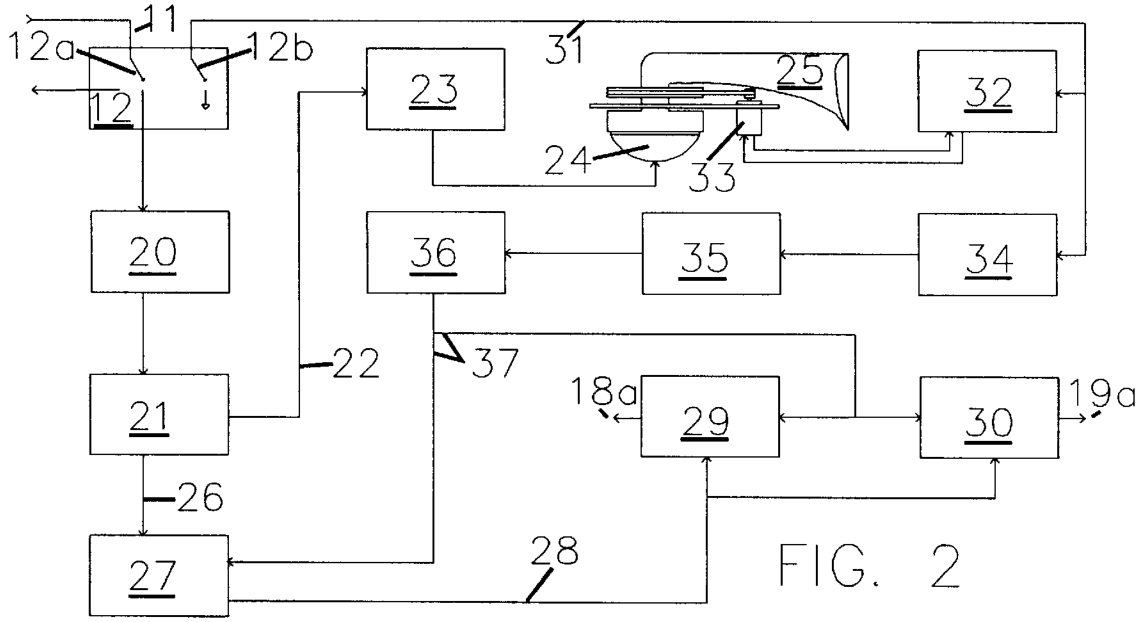

A block diagram of the presently preferred embodiment is shown on FIG. 2. The audio signal from a keyboard, guitar, or other source passes from wire 11 through switch 12 to preamplifier 20 where it is amplified and fed to a low-power active cross-over filter 21. High frequency components of the audio signal 22 are fed through a power amplifier 23 to the loudspeaker horn-driver 24. Sound from the speaker 24 is coupled into a rotating horn 25 that induces tremolo in and radiates sound in a manner similar to a Leslie-type system.

Low frequency components of the audio signal 26 from the crossover filter 21 are fed to a voltage-variable phase shifter 27, the phase shifted signal 28 then feeds a left amplitude modulator 29 and a right amplitude modulator 30 to form the modulated low frequency signals 14.

A motor speed control signal 31 has the possible values fast and slow; corresponding to the desired tremolo rate. The motor control signal comes from a push on, push off, pushbutton control 12*b* of foot switch 12. In one position of the switch the signal is a ground connection and in the other position, it is an open connection. This motor speed control signal 31 feeds a motor control circuit 32 that powers the motor 33 that rotates the rotating horn 25. This motor control signal also drives a ramp control circuit 34 that simulates the acceleration and deceleration of the rotating low-frequency deflector element of a Leslie-type system. The ramp control circuit 34 drives a voltage-controlled oscillator 35 and sine converter 36 to produce a sine wave 37 that simulates the rotation of the low frequency deflector element of a Leslie-type system. The sine wave 37 then controls the phase shift applied to the low frequency components of the audio signal by the phase shifter 27 and the right-left volume shift applied by the right 30 and left 29 amplitude modulators.

Figure 3:
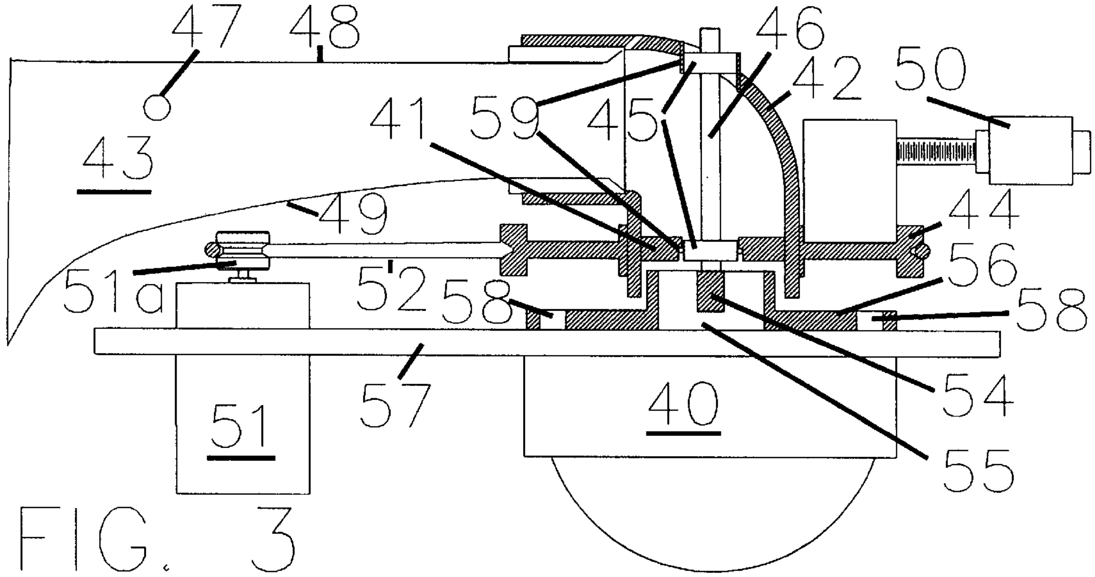
Figure 14:
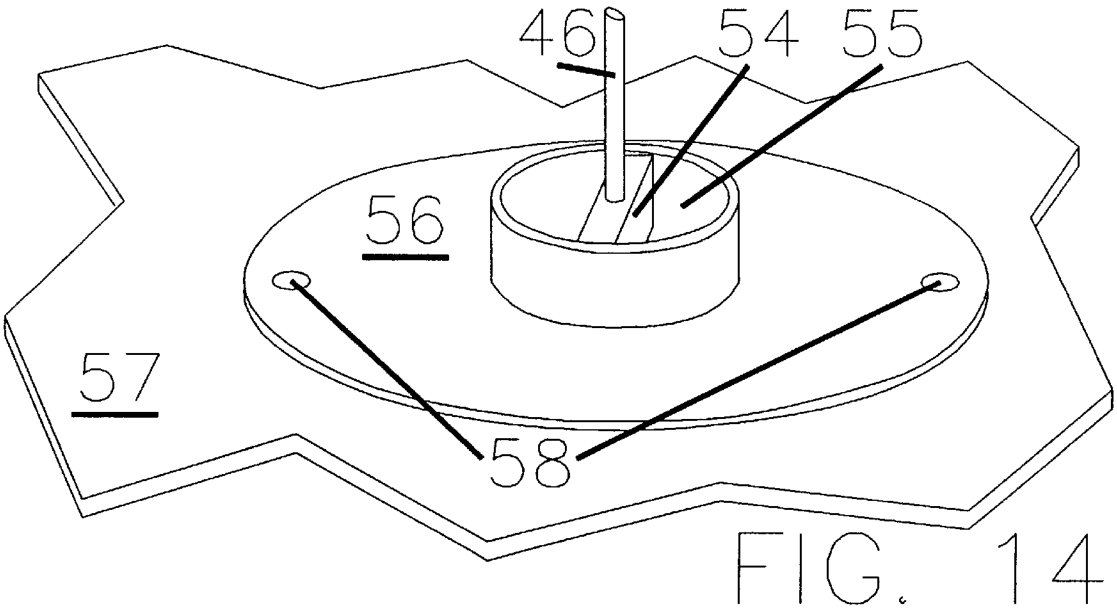

FIG. 3 shows the rotating horn assembly used by the present invention for producing tremolo at mid-high frequencies. A loudspeaker horn-driver 40 generates sound pressure waves that couple through holes in a bearing support 41 into the cavity of an elbow 42, and from there into a semi-exponential horn 43. A pulley wheel 44 is attached to the elbow such that rotation of the pulley wheel will cause the elbow and horn to rotate on bearings 45 about an axle shaft 46. The axle shaft 46 is attached to cross bar 54, FIG. 14, extending across sound opening 55 of bracket 56, which is secured to cabinet shelf 57, FIGS. 3 and 14, such as by screws 58. It has been found advantageous to provide rubber sleeves 59 between bearings 45 and horn elbow 42 to further reduce vibration for more quiet operation. As the horn rotates within the cabinet or housing 17, FIGS. 1 and 4, air pressure builds up in front of the horn and a mild vacuum develops within the horn; this pressure differential is relieved by a vacuum elimination hole 47 in the leading edge or side of the horn. Relief of this vacuum avoid popping noises as the horn rotates past openings 53 in the housing. Note that the top edge of the horn 48 is nearly straight while the bottom edge 49 of the horn is flared downwardly, this configuration allows for a more compact cabinet, of roughly 5⅛ inches internal height, than would be the case if the horn flared equally in both vertical dimensions. A counterweight 50 helps make for smooth operation.

In the preferred embodiment, the distance from the axle shaft 46 to the end of the horn 43 is approximately seven inches, the vacuum elimination hole 47 is approximately one third to one half inch in diameter, and this hole is located approximately one and three fourths inches from the end of the horn.

Figure 11:
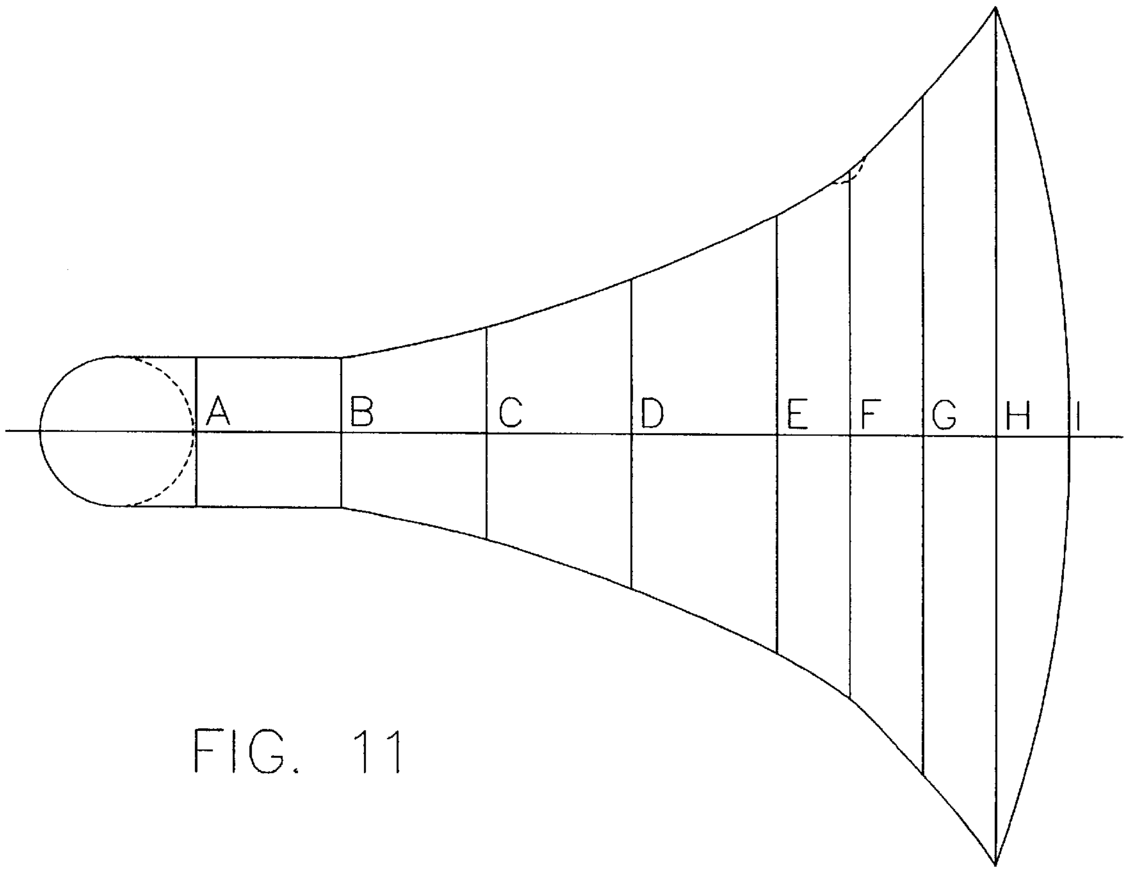
Figure 12:
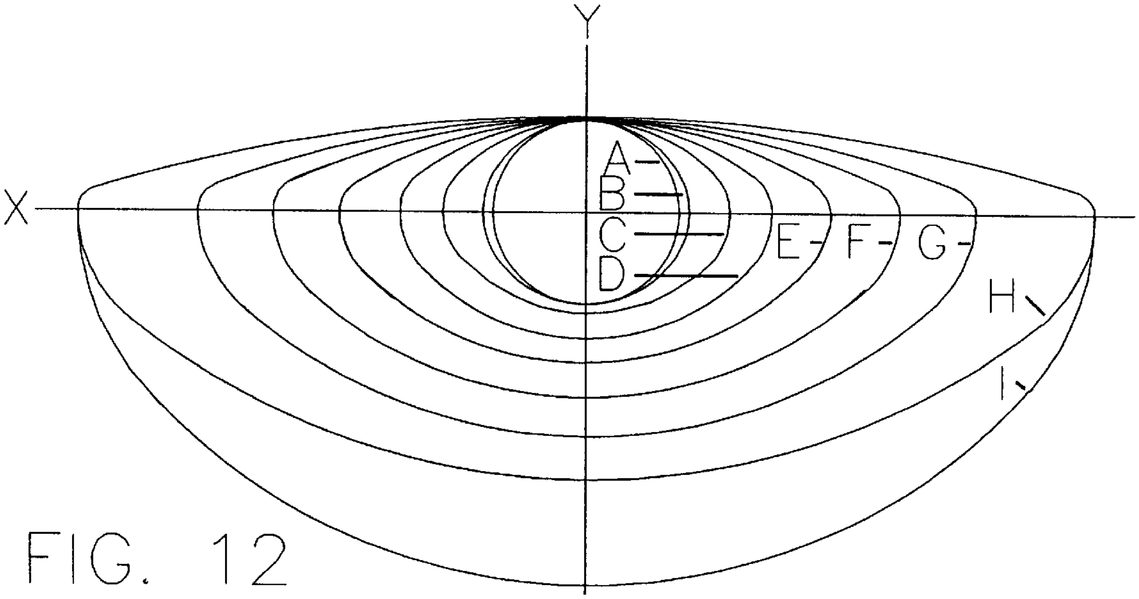

Yet more details of the shape of the horn can be seen by referencing the sections A through I shown on FIGS. 11 and 12. The top view of FIG. 11 shows the location of the vacuum relief hole 47 and the approximate location of the cross sections. The physical dimensions of the cabinet and horn should remain within ±/−25% of the values disclosed for best operation. Dimensions of the horn at the labeled sections are given in the following table: All dimensions in this table are given in inches or square inches.

| Index | Axis-section | X axis length | Y axis length | cross-section Area |
|---|---|---|---|---|
| A | 1.0 | 1.093 | 1.093 | 0.938 |
| B | 2.0 | 1.216 | 1.093 | 1.043 |
| C | 3.0 | 1.700 | 1.150 | 1.499 |
| D | 4.0 | 2.200 | 1.300 | 2.088 |
| E | 5.0 | 2.900 | 1.466 | 3.184 |
| F | 5.5 | 3.700 | 1.670 | 4.637 |
| G | 6.0 | 4.600 | 1.900 | 6.622 |
| H | 6.5 | 6.00 | 2.170 | 9.677 |
| I | 7.0 | 6.00 | 2.816 | 12.896 |

Figure 4:
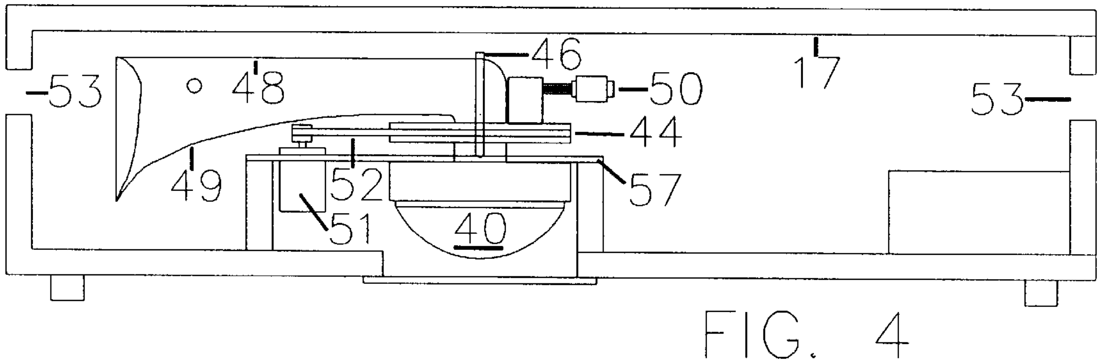

The advantage of the horn shape is shown in FIG. 4. The loudspeaker horn driver 40 takes up substantial room at the bottom of the cabinet, despite the recess in the bottom of the cabinet in which the horn driver fits. Through having the top of the horn 48 essentially straight while the bottom of the horn 49 expands at its distal end, a more compact cabinet is had. The horn is rotated by motor 51 and drive belt 52 that extends between motor pulley 51*a* and horn pulley wheel 44.

Figure 13:
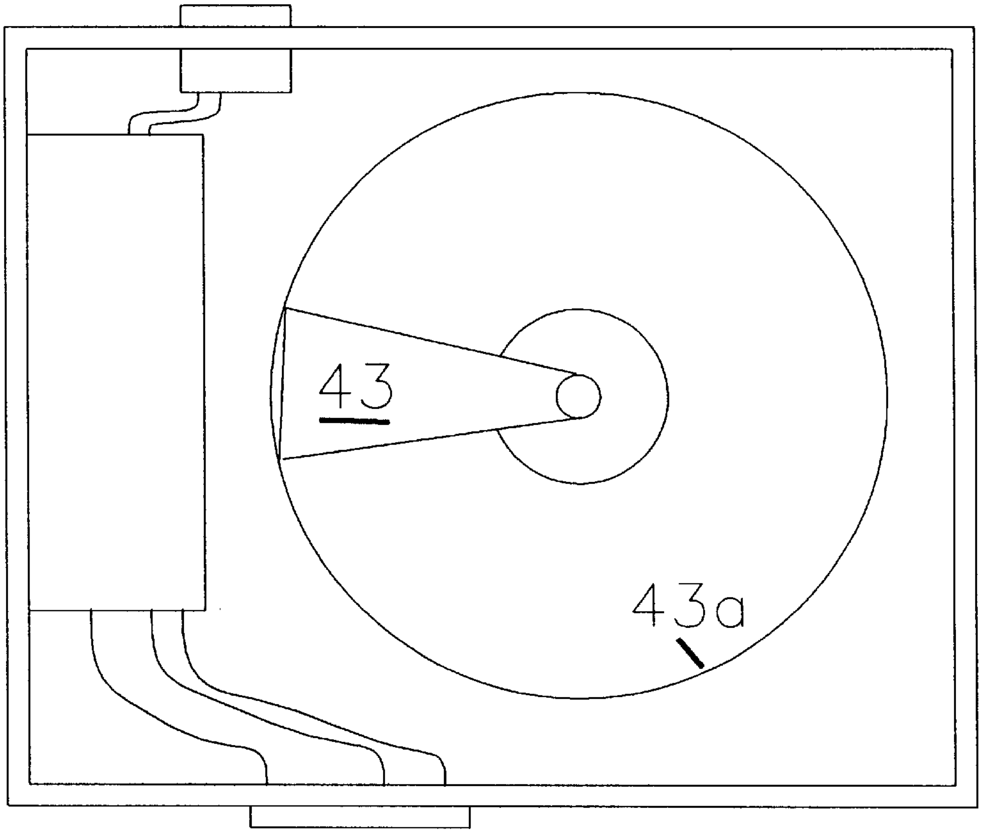

A top view of the horn is shown in FIG. 13. The cabinet is approximately 16 inches long by 20 inches wide. The axis of rotation of the horn is located at about 38% of the width and about 44% of the length of the cabinet for best resonant effect. The circle of rotation of the horn is indicated by circle 43*a*. Ports 53, FIG. 1, are provided in the cabinet walls. It should be noted from FIG. 1, that the ports 53 in the front of the cabinet provide about double the opening for sound passage as do the parts in the sides and back of the cabinet. The ports in the hidden side and back of the cabinet are simimlar to the single side port shown.

Figure 5:
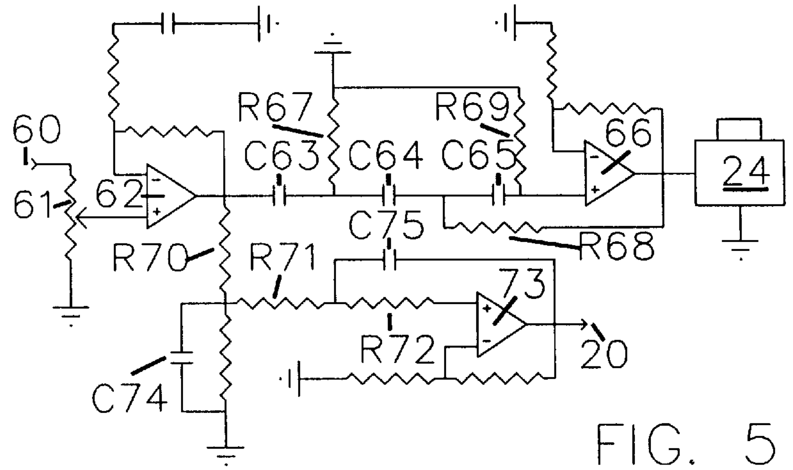

FIG. 5 shows details of the crossover network and mid-high range power amplifier, corresponding to blocks 21 and 23 on FIG. 2. The switched audio input signal 60 is fed through a volume control 61 to a preamplifier 62. High frequency components of the audio signal pass through capacitors C63, C64, and C65, are amplified by the power amplifier 66, and drive the loudspeaker horn driver 24. Low frequency components of the audio signal are eliminated from the drive to the speaker because these components are bypassed through resistors R67, R68, and R69. Capacitors C63, C64, and C65, together with resistors R67, R68, and R69, and the amplifier 66, form a high-pass active filter.

Low frequency components of the audio signal pass through resistors R70, R71, and R72 into a filter amplifier 73 to form the crossover low frequency output 26. High frequency components are eliminated through capacitors C74 and C75. Capacitors C74 and C75, together with resistors R70, R71, and R72 and the amplifier 73 form a low-pass active filter.

Figure 6:
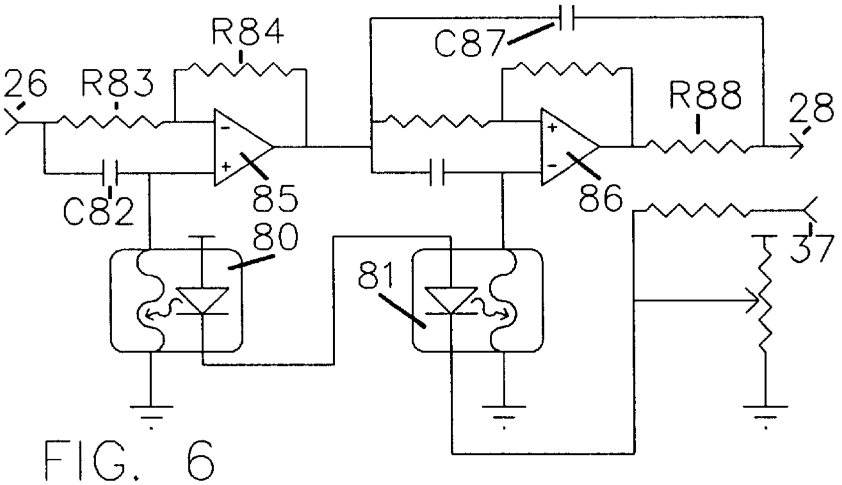

The crossover low frequency output 26 connects to the voltage-variable phase-shift network, block 27 on FIG. 2. Details of this network are shown on FIG. 6. The audio signal enters at 26. The phase-control sine wave 37 changes the amount of effective resistance offered by the Silonex NSL-32 linear photoconductive optoisolators 80 and 81. A phase shifter is formed by capacitor C82, isolator 80, resistors R83 and R84, and amplifier 85. When the resistance of isolator 80 is high, little phase shift will take place at the amplifier 85 output. When the resistance of isolator 80 is low, a substantial phase shift will occur. Amplifier 86 forms a similar phase shifter. The amount of phase shift is determined by the frequency of the audio signal, and the values of the components. The phase shifted output 28 is formed by capacitor C87 and resistor R88 from the partially phase shifted signal at the output of amplifier 85 and the phase shifted signal at the output of amplifier 86. The formation of a phase shifted output in this manner adds some resonances by adding and cancelling some frequencies differently than others; the result is an enhanced richness to the sound.

Figure 7:
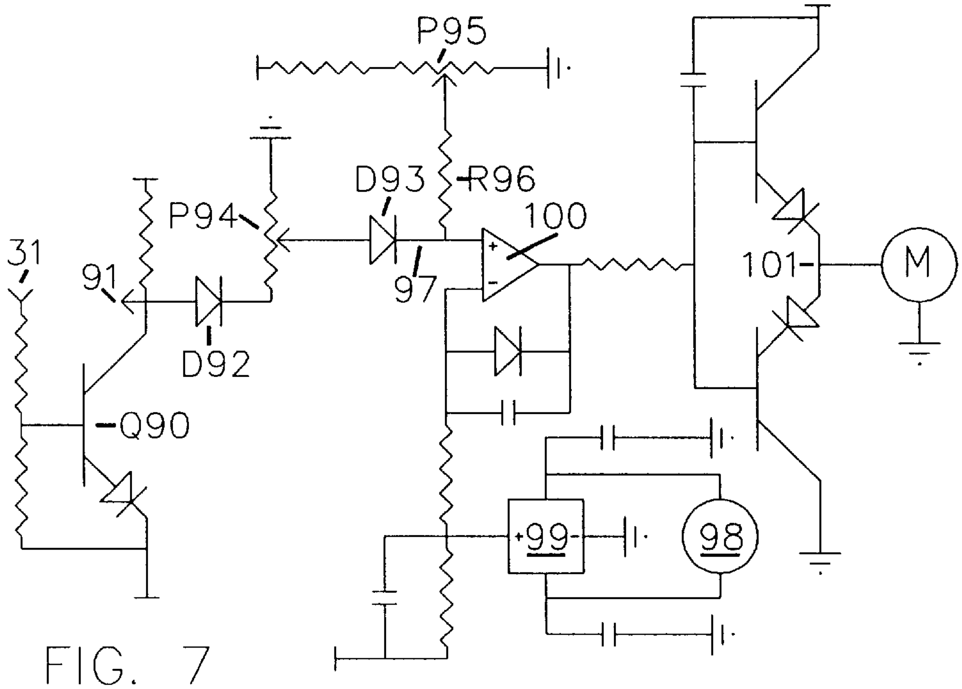

The speed control input 31 from speed control switch 12*b* goes to the ramp control circuit (block 34 on FIG. 2) and to the motor speed control, block 32 on FIG. 2, details of which are shown on FIG. 7. The speed control input 31 is buffered by transistor Q90 to form a buffered speed control signal 91 that also goes to the ramp control, block 34 on FIG. 2. Diodes D92 and D93, with potentiometers P94 and P95, and resistor R96, produce a motor speed request signal 97 that is individually adjustable in voltage for the fast and slow speed settings. While in the present preferred embodiment these potentiometers are trimmers located on the circuit board, future implimentations may provide for user adjustment of these speed settings. A speed-detection servo winding 98 on the motor generates an alternating current of voltage proportional to the actual motor speed. This servo winding 99 voltage is rectified by bridge rectifier BR98 to produce a DC voltage proportional to actual motor speed. This actual motor speed voltage is compared to the motor speed request signal by amplifier 100 and buffered to create a motor drive current 101. The motor may be dynamically braked when the amplifier output 100 is substantially below the buffered motor drive current voltage 101.

Figure 8:
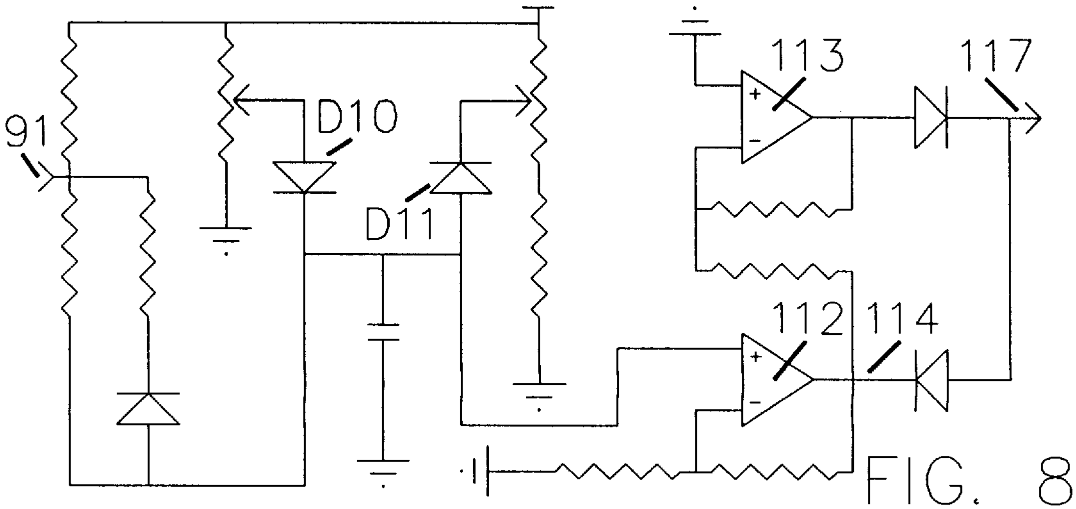

The speed control input 31 goes to the ramp control circuit, block 34 on FIG. 2, details of which are shown on FIG. 8. The buffered speed control signal 91 is clamped through diodes D110 and D111 and buffered by amplifiers 112 and 113 to form a modulation rate request signal 114 that is individually adjustable in voltage for the fast and slow speed settings. While in the present preferred embodiment the potentiometers by which the modulation rate request signal is set for the fast and slow speed settings are trimmers located on the circuit board, future implementations may provide for user adjustment of these speed settings. Diodes D115 and D116 (FIG. 8) form a voltage clamp in the voltage controlled oscillator of blocks 35 and 36 (FIG. 2), details of which are shown by FIG. 9; this clamped voltage is at 117.

Figure 9:
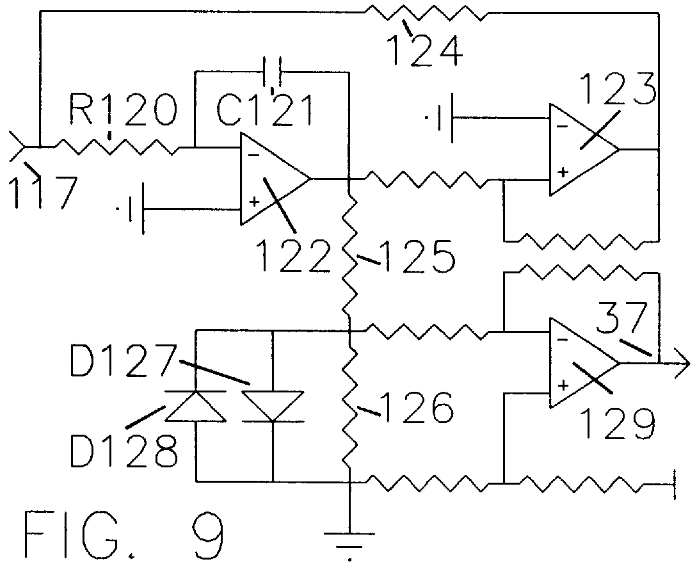

More details of the voltage controlled oscillator circuit of blocks 35 and 36 (FIG. 2) are shown on FIG. 9. The modulation rate request signal 114 (FIG. 8) controls the clamped voltage 117 of the R-C oscillator, which controls the current in the R-C oscillator formed by resistor R120, capacitor C121, amplifier 122, amplifier 123, and resistor R124. The triangle wave at the output of amplifier 122 is shaped into an approximation of a sine wave by resistors R125 and R126 and diodes D127 and D128, this sine wave is buffered by amplifier 129 to form the modulation sine wave 37.

The modulation sine wave 37 connects to both the left-right amplitude modulator circuits (FIG. 2, blocks 29 & 30), and to the phase shifter (FIG. 2, block 27).

Figure 10:
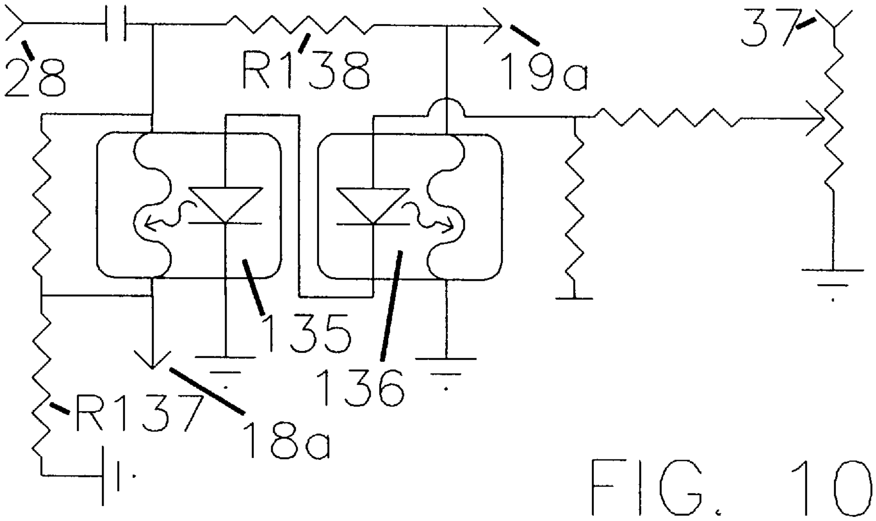

FIG. 10 shows details of the left and right amplitude modulator circuits. The modulation sine wave 37 is used to control the resistance of a pair of optoisolators 135 and 136. These isolators are coupled with resistors R137 and R138 to form a pair of attenuators that change their attenuation in opposite directions with the modulation sine wave 37. These attenuators form a left audio output and a right audio output 14.

Figure 15:
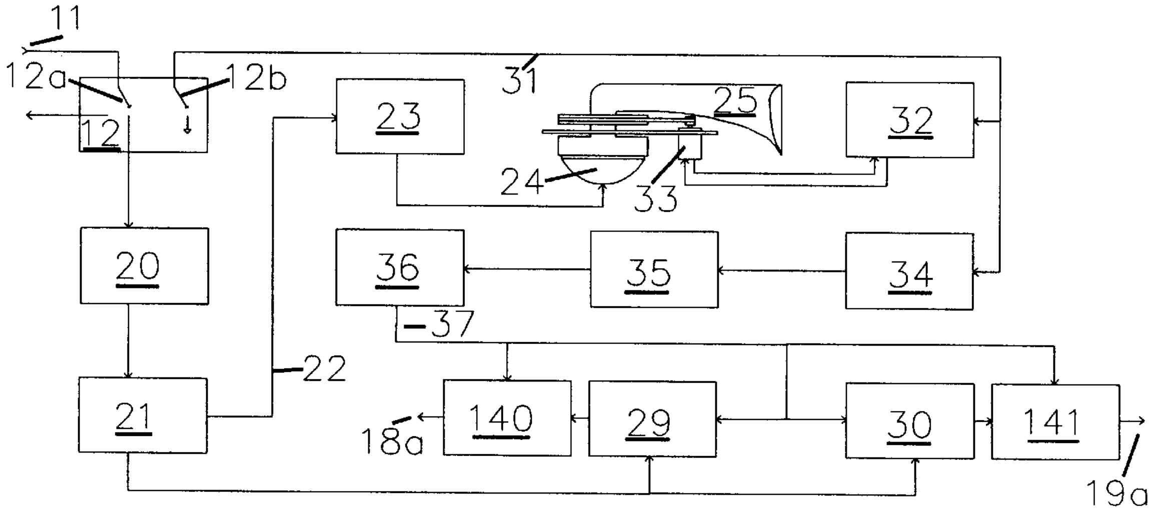

This present invention is not intended to be limited to the exact mechanism and circuitry used in the present preferred embodiment. Many equivalent structures for each block come to mind, only a few of which will be summarized here. The present preferred embodiment uses a high-power operational amplifier as both an element of the crossover filter and as a power driver for the mid-high range loudspeaker horn-driver; these functions can easily be separated. The phase shift function could easily be accomplished after the left-right modulation function, as shown by the arrangement of phase shifter and mixer blocks 140 and 141 of FIG. 15 the configuration of the preferred embodiment allows use of a single phase modulator. Similarly, the crossover filter, voltage variable gain stages used in the left and right output modulators, and the variable phase shifter can all be implimented digitally; a variable phase-shift could be implimented as a FIFO buffer or RAM in which samples are stored at a first rate, but removed at a second rate, where the difference in the rates corresponds to the desired phase modulation.

Alternatives also exist for the various mechanical components of the present invention. While the present implimentation uses an electric motor and belt to drive the rotating horn, a geared, or even a direct drive, or the use of a pneumatic or a hydraulic motor, would lead to equivalent tremolo. Similarly, slip rings could be used to feed audio signals to a horn driver, where the horn driver rotates with the horn. While rubber isolated ball bearings are preferred for the horn, bronze bearings have produced results useable in a performance situation.

Whereas this invention is here illustrated and described with reference to embodiments thereof presently contemplated as the best mode of carrying out such invention in actual practice, it is to be understood that various changes may be made in adapting the invention to different embodiments without departing from the broader inventive concepts disclosed herein and comprehended by the claims that follow.

We claim:

1. A tremolo producing system comprising:

a housing having openings;

a mid-high range loudspeaker element disposed within said housing for producing sound;

a horn rotatably disposed within said housing and coupled to receive sound from said mid-high range loudspeaker element and to distribute said sound through said openings in said housing;

a motor coupled to said horn for rotating it within said housing at a selected speed;

an amplifier coupled to drive said mid-high range loudspeaker element;

an oscillator to generate a tremolo modulation signal;

means operatively connected to the oscillator for relating the modulation signal to the selected speed of rotation of the horn;

a variable phase shifter having an audio input and output, where the phase shifter produces a phase shift corresponding to the tremolo modulation signal;

a crossover filter coupled to drive said amplifier with signals higher than a crossover frequency and to drive the audio input of the variable phase shifter with those signals of less than the crossover frequency;

an amplitude modulator having an output and an input coupled to receive the audio output of the variable phase shifter, the amplitude of the output of the amplitude modulator corresponding to the tremolo modulation signal.

2. The tremolo producing system of claim 1 wherein the rotating horn extends approximately 7 inches distal from its axis of rotation.

3. The tremolo producing system of claim 1, wherein the horn has a direction of rotation and has a leading side in the hole of rotation, and wherein there is a vacuum relief hole in the leading side of the horn located at approximately three fourths of a distance that the horn extends from the axis of rotation of said horn.

4. The tremolo producing system of claim 1, further comprising: a second amplitude modulator having an output and an input coupled to receive the audio output of the variable phase shifter, the amplitude of the output of the second amplitude modulator corresponding to the inverse of the tremolo modulation signal.

5. The tremolo producing system of claim 1, further comprising: a second amplitude modulator having an output and an input, the amplitude of the output of the second amplitude modulator corresponding to the inverse of the tremolo modulation signal; and a second variable phase shifter having an audio input and output, the phase shift of said second shifter corresponding to the tremolo modulation signal, and the audio input of the second shifter coupled to receive the output of the second amplitude modulator.

6. The tremolo producing system of claim 1, wherein the horn has a direction of rotation and has a leading side in the direction of rotation, and wherein there is a vacuum relief hole in the leading side of the horn and located at approximately three fourths of a distance that the horn extends from an axis of rotation of the horn.

7. The tremolo producing system of claim 6 wherein mechanical vibrations from at least one bearing of a mounting for the horn are isolated from the horn by an elastomeric sleeve between the bearing and the horn.

8. A horn for a speaker having an end, a length, a top, a bottom, a leading side, and a trailing side, for an electromechanical tremolo production device having a length extending approximately seven inches from the end, a center line of the top of the horn is straight, the leading and the trailing sides of the horn flared equally from a center line of the horn, the area of a section perpendicular to the length of the horn one inch distal to the end is approximately one square inch, the area of a section perpendicular to the length of the horn three inches distal to the end is approximately one and a half square inch, the area of a section perpendicular to the length of the horn five inches distal to the end is approximately 3.2 square inches, the area of a section perpendicular to the length of the horn six inches distal to the end is approximately 6.6 square inches, and the area of a section perpendicular to the length of the horn six and a half inches distal to the end is approximately nine and two thirds square inches.

9. The horn of claim 8 further having a vacuum relief hole in the leading side of the horn.

10. A tremolo producing system comprising:

a housing having openings;

a mid-high range loudspeaker element disposed within said housing for producing sound;

a horn rotatably disposed within said housing and coupled to receive sound from said mid-high range loudspeaker element and to distribute said sound through said openings in said housing, said horn having a top, and end, a bottom,a leading side, and a trailing side, and wherein the horn has:

a length extending approximately seven inches from the end, a center line of the top of the horn is straight, the leading and the trailing sides of the horn flared equally from a center line of the horn, the area of a section perpendicular to the length of the horn one inch distal to the end is approximately one square inch, the area of a section perpendicular to the length of the horn three inches distal to the end is approximately one and a half square inch, the area of a section perpendicular to the length of the horn five inches distal to the end is approximately 3.2 square inches, the area of a section perpendicular to the length of the horn six inches distal to the end is approximately 6.6 square inches, the area of a section perpendicular to the length of the horn six and a half inches distal to the end is approximately nine and two thirds square inches, and a vacuum relief hole in the leading side of the horn located at approximately three fourths of a distance that the horn extends from an axis of rotation of the horn;

a motor coupled to said horn for rotating it within said housing;

an amplifier coupled to drive said mid-high range loudspeaker element;

an oscillator to generate a tremolo modulation signal;

a variable phase shifter having an audio input and output, where the phase shifter produces a phase shift corresponding to the tremolo modulation signal;

a crossover filter coupled to drive said amplifier with signals higher than a crossover frequency and to drive the audio input of the variable phase shifter with those signals of less than the crossover frequency;

an amplitude modulator having an output and an input coupled to receive the audio output of the variable phase shifter, the amplitude of the output of the amplitude modulator corresponding to the tremolo modulation signal.

* * * * *